US011515512B2

(12) United States Patent
Aurongzeb et al.

(10) Patent No.: US 11,515,512 B2
(45) Date of Patent: Nov. 29, 2022

(54) THERMALLY CONDUCTIVE POLED DAMPING ASSEMBLY

(71) Applicant: Dell Products L.P., Round Rock, TX (US)

(72) Inventors: Deeder M. Aurongzeb, Austin, TX (US); Jong Seo Lee, Austin, TX (US); Travis C. North, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 59 days.

(21) Appl. No.: 16/951,051

(22) Filed: Nov. 18, 2020

(65) Prior Publication Data

US 2022/0158119 A1    May 19, 2022

(51) Int. Cl.
| | | |
|---|---|---|
| *H01L 51/52* | (2006.01) | |
| *G09G 3/3208* | (2016.01) | |
| *H01L 27/32* | (2006.01) | |
| *G06F 1/16* | (2006.01) | |
| *H01L 51/00* | (2006.01) | |

(52) U.S. Cl.
CPC .......... *H01L 51/529* (2013.01); *G06F 1/1616* (2013.01); *G06F 1/1681* (2013.01); *G09G 3/3208* (2013.01); *H01L 27/3244* (2013.01); *H01L 51/0097* (2013.01); *H01L 51/5237* (2013.01); *G09G 2320/041* (2013.01); *G09G 2330/045* (2013.01); *H01L 2251/5338* (2013.01)

(58) Field of Classification Search
CPC ............... H01L 51/529; H01L 51/0097; H01L 51/5237; H01L 27/3244; G06F 1/1681; G06F 1/1616; G09G 3/3208
USPC .......................................................... 345/76
See application file for complete search history.

(56) References Cited

U.S. PATENT DOCUMENTS

| 9,715,247 | B2 | 7/2017 | Ozyilmaz | |
| 10,401,926 | B1* | 9/2019 | North | G06F 1/1618 |
| 2016/0336523 | A1 | 11/2016 | Kwon et al. | |
| 2017/0263179 | A1* | 9/2017 | Aurongzeb | G06F 1/183 |
| 2019/0035324 | A1* | 1/2019 | Aurongzeb | G06F 1/1652 |
| 2020/0010748 | A1* | 1/2020 | Lin | B32B 27/322 |

OTHER PUBLICATIONS

Ruud Heijmansand Teijin Aramid A Novel high temperature and flame resistant Twaronaramid foam Mar. 2017 ECI_Digital_library_Aramid_Foam Abstarct.*
Zeng Zhaoyonget al. Apr. 2016 High-tempearture-resistantfoam A-interlayer composite antennacover and preparation method thereof CN 109638445 (A) English translation.*

(Continued)

*Primary Examiner* — Prabodh M Dharia
(74) *Attorney, Agent, or Firm* — Zagorin Cave LLP; Robert W. Holland

(57) ABSTRACT

A portable information handling system integrates a display film having OLED pixels to a housing with a graphene foam having graphene particles disposed in an intermediary material with varied orientations that promote thermal transfer from the display film. For example, graphene particles disposed in a silicon resin to form the foam couples between a portable housing and a display film to transfer thermal energy to the portable housing from the display film.

20 Claims, 2 Drawing Sheets

(56) References Cited

OTHER PUBLICATIONS

Zeng Zhaoyonget al. Apr. 2016 High-tempearture-resistantfoam A-interlayer composite antennacover and preparation method thereof CN 109638445 (A) Chinese translation.*

Liu Wen-Liang For LCD, OLED Display Screen Of Graphene Foam Adhesive Tape Jun. 1, 2018 Hengshan Jiacheng New Materials co. LTD abstract, paragraphs 3, 5, 9, 10, 31 English Translation (Year: 2018).*

Liu Wen-Liang For LCD, OLED Display Screen Of Graphene Foam Adhesive Tape Jun. 1, 2018 Hengshan Jiacheng New Materials co. LTD abstract, paragraphs 3, 5, 9, 10, 31 Original Documents (Year: 2018).*

Kim, H., et al., "Fabrication and Properties of Flexible OLEDs on Polyimide-Graphene Composite Film Substrate," Proceedings of the Advanced Display Materials and Devices, 2013—Issue 1, downloaded from Fabrication and Properties of Flexible OLEDs on Polyimide-Graphene Composite Film Substrate: Molecular Crystals and Liquid Crystals: vol. 584, No. 1 (tandfonline.com) on Aug. 5, 2021, 3 pages.

* cited by examiner

THERMALLY CONDUCTIVE POLED DAMPING ASSEMBLY

BACKGROUND OF THE INVENTION

Field of the Invention

The present invention relates in general to the field of portable information handling system displays, and more particularly to an information handling system thermally conductive POLED damping assembly.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems integrate processing components, a display and a power source in a portable housing to support mobile operations. Portable information handling systems allow end users to carry a system between meetings, during travel, and between home and office locations so that an end user has access to processing capabilities while mobile. Tablet configurations typically expose a touchscreen display on a planar housing that both outputs information as visual images and accepts inputs as touches. Convertible configurations typically include multiple separate housing portions that couple to each other so that the system converts between closed and open positions. For example, a main housing portion integrates processing components and a keyboard and rotationally couples with hinges to a lid housing portion that integrates a display. In a clamshell configuration, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility.

Portable information handling systems typically integrate a flat panel display that minimizes housing height with a thin structure. Conventional systems have used liquid crystal displays that generate visual images with backlight illumination passed though liquid crystal light filters. The use of the backlight to generate illumination behind a flat panel of liquid crystal filters tends to increase the display thickness. Generally a more thin display may be supported with an organic light emitting diode (OLED) display film that generates illumination by applying current to organic matter that generates red, green and blue illumination. Since each pixel actively generates its own illumination, a backlight is not needed so that the display panel has a reduced thickness. In addition, OLED display films are flexible so that the display can fold at the housing. For instance, an OLED display film may be disposed over both housing portions of an information handling system so that the display folds when the housing portions rotate open and closed. That is, the display film replaces the keyboard of a conventional convertible information handling system, which tends to reduce the thickness of the housing while offering a virtual input device of a keyboard presented on the display. To aid in the flexing of the display, the OLED typically has a plastic substrate behind the display film in a configuration typically referred to as a Plastic OLED (POLED) display film.

One difficulty with the use of OLED and POLED display films that generate illumination to create a visual image is that power dissipated through the organic matter to create illumination also generates thermal energy as a byproduct. To help manage this thermal energy, the housing typically disposes a glass back cover behind the display film with a copper coating and polymer foam (such as with 0.2 mm thickness) to offer EMI shielding. Generally, however, the polymer foam is not typically conductive of thermal energy and the copper foil does not offer structural support. Thus, thermal energy generated by presentation of visual images at OLED pixels can result in excessive temperatures that can damage the OLED material and the plastic substrate. Thermal management may become especially acute where low profile portable information handling systems present bright and active visual images, such as in support of a gaming application. Thermal constraints that force a decrease in the brightness or refresh rate of an OLED or POLED display impact the end user experience at the portable information handling system.

SUMMARY OF THE INVENTION

Therefore, a need has arisen for a system and method which aids in dissipation of thermal energy from an OLED or POLED display film.

In accordance with the present invention, a system and method are provided which substantially reduce the disadvantages and problems associated with previous methods and systems to manage thermal energy generated at a display. A graphene foam couples between an OLED display film and a housing to provide enhance thermal energy transfer from the display film to the housing.

More specifically, a portable information handling system processes information with a processor and memory disposed in a portable housing for presentation at a display integrated in the portable housing. The display is an organic light emitting diode (OLED) film having illumination generated by red, green and blue pixels that create heat as a byproduct of illumination generation. To aid in removal of excess thermal energy from the display, a graphene foam is disposed between the display film and housing. The graphene foam has graphene particles suspended in an intermediary material, such as a silicon resin, so that thermal energy passes from the display film through the graphene foam to the housing. The graphene foam may couple directly to the housing and the display film or may have an interface between the housing and display film, such as a graphene sheet.

The present invention provides a number of important technical advantages. One example of an important technical advantage is that an OLED or POLED display film disposed in a portable information handling system housing rejects excess thermal energy through a graphene foam to a housing. Dissipation of excess thermal energy allows the display to present visual images with increased brightness and refresh rates for an improved end user experience. The graphene foam provides a flexible support to the display film where housing rotation folds the display film, such as over a hinge that rotationally couples housing portions to each other. More effective thermal rejection through a flexible graphene foam helps to decrease display and housing thickness while providing a POLED plastic substrate with support that reduces the risk of display film damage.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A portable information handling system display film is supported by a graphene foam that provides improved rejection of excess thermal energy. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
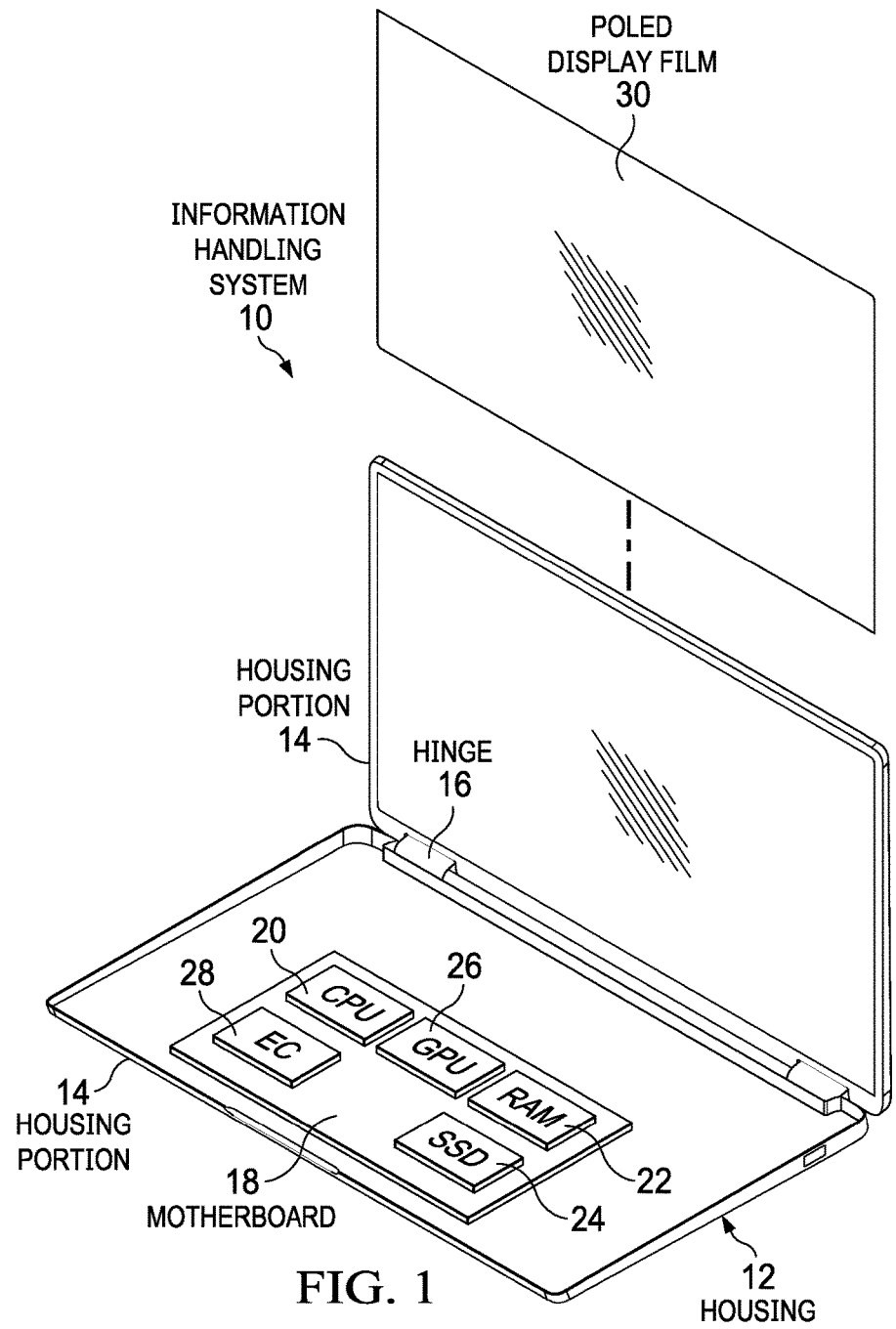
FIG. 1 depicts an exploded perspective view of a portable information handling system having a POLED display film.

Referring now to FIG. 1, an exploded perspective view depicts a portable information handling system 10 having a POLED display film 30. In the example embodiment, portable information handling system 10 processes information with processing components disposed in a housing 12 having first and second housing portions 14 rotationally coupled by a hinge 16. One housing portion 14 integrates a motherboard 18 that interfaces the processing components to cooperate to process information. A central processing unit (CPU) 20 executes instructions, such as an operating system and applications, to process information stored in a random access memory (RAM) 22. For example, the instructions and information are retrieved to RAM 22 from persistent memory, such flash memory of a solid state drive (SSD) 24, for processing by CPU 20. A graphics processing unit (GPU) 26 interfaced with CPU 20 and POLED display film 30 further processes information to define pixel values that generate visual images for presentation to and end user at POLED display film 30. An embedded controller 28 provides management of interactions between physical processing components, such as to apply power and accept end user inputs. In the example embodiment, POLED display film 30 has a length that extends across both housing portions 14 and folds at hinge 16 as housing 12 rotates between the planar table configuration that is depicted in a closed position. In alternative embodiments, POLED display film 30 or an OLED display film may be disposed over just one housing portion 14 while a physical keyboard is disposed over the other housing portion, such as for a conventional convertible information handling system configuration.

Figure 2:
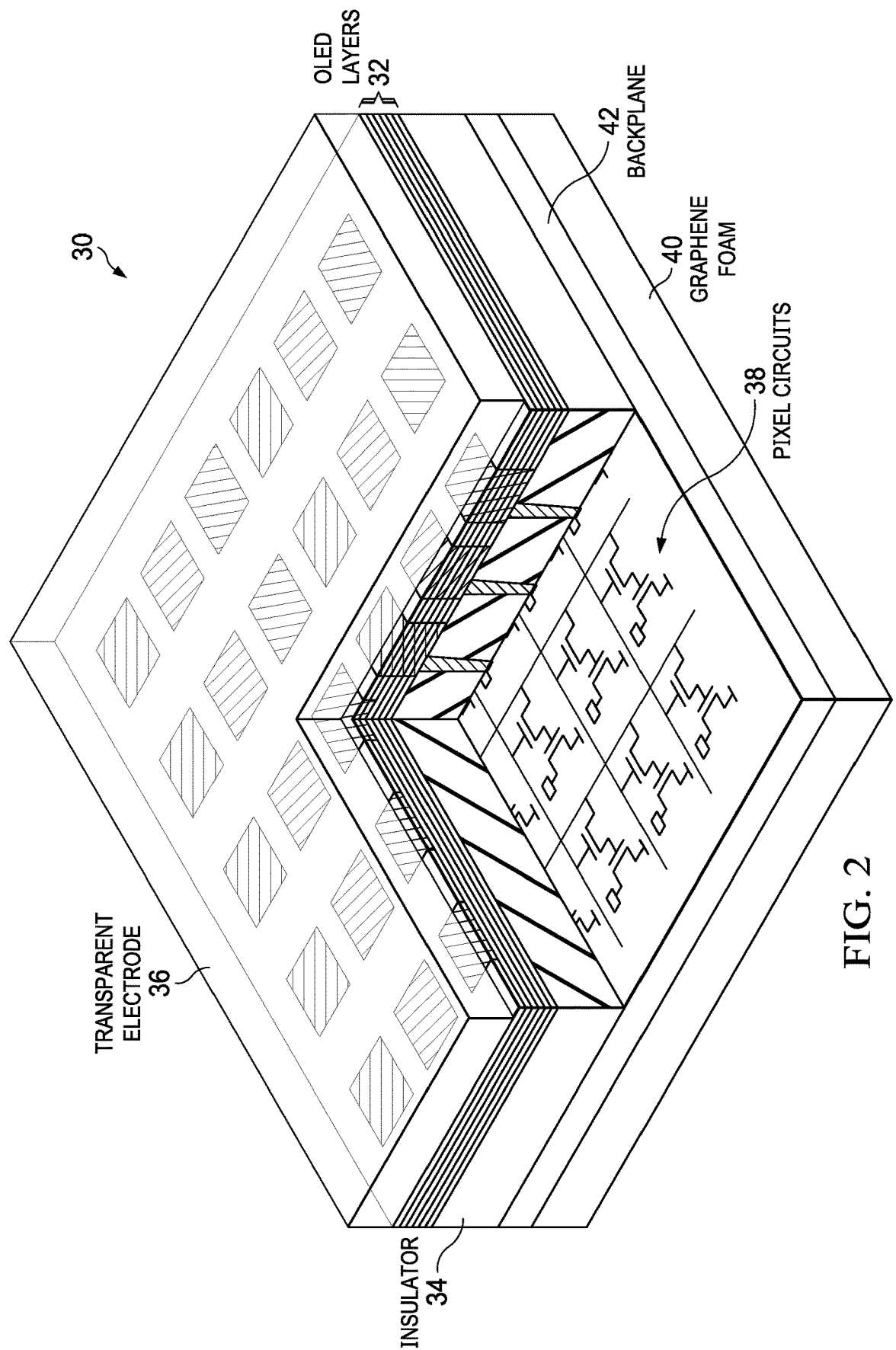
FIG. 2 depicts a side perspective cutaway view of a POLED display film supported by a graphene foam.

Referring now to FIG. 2, a side perspective cutaway view depicts a POLED display film 30 supported by a graphene foam 40. An OLED layer 32 integrates plural pixels that illuminate to present visual images based upon combinations of different brightness at red, blue and green OLED materials. Each portion of OLED material in OLED layer 32 interfaces through an insulator layer 34 with a transparent electrode 36 to pixel circuit layer 38. To present a visual image, a graphics processor defines pixel values that are communicated to a timing controller of POLED display film 30 so that current applied through pixel circuit layer 38 and transparent electrodes 36 cause organic material in OLED layer 32 to generate a desired illumination and color. The organic material illumination dissipates power and thereby generates thermal energy as a byproduct. A plastic substrate backplane 42 couples to the bottom side of pixel circuit layer 38 to provide flexibility of POLED display film 30, such as to support folding at an information handling system hinge. In an alternative embodiment of an OLED display film that does not fold, the substrate backplane 42 may be glass or another type of inflexible material.

A graphene foam 40 couples to the bottom surface of POLED display film 30 to provide a flexible support surface and a thermally conductive material to help dissipate thermal energy generated by illumination of organic material within OLED layer 32. As an example, graphene foam 40 is manufactured by mixing graphene particles in an intermediary material, such as a silicon resin, to form a foam consistency, such as by heating the silicone resin with a predetermined molding temperature, pressure and time. For example, graphene foam 40 is formed with a molding temperature of approximately 130 degrees Celsius, a molding pressure in a range of 1000-160 psi and a molding time of approximately 75 minutes. Variations of molding conditions may be applied based upon a density of graphene particles that is mixed with the intermediary material. Generally, graphene provides an excellent conductor of thermal energy is an X-plane aligned with the graphene crystal structure but provides little thermal conductance outside of the X-plane. To provide a more uniform thermal conductance, graphene particles mixed with the intermediary material tend to align along random axes so that thermal energy conducts through the particles in all directions within graphene foam 40. In one example embodiment, the mass fraction of graphite as a percentile of weight is 4% to provide a thermal conductivity of approximately 2 W/m-k. In alternative embodiments, the mass fraction of graphite may vary between 2 and 10 percent for thermal conductivity of less than 1 W/m-K to 5 W/M-K. Thermal conductivity of 2 to 6 W/m-K may be achieved with bulk density of porous graphene foam of 0.04 to 0.1 g/cm. One example of a graphene foam 40 is the Graphite-PAD available from Panasonic and described at https://industrial.panasonic.com/ww/pgs2/graphite-pad.

The graphene foam is a composite material with high thermal conductivity and strength that provides a flexible support under an OLED or POLED display film. Replacing copper or other supporting materials with a graphene foam reduces thermal interface resistance and creates a conductive base that may further interact with a graphene sheet or composite at the interface. Other similar graphene composite materials may be used. For example, a Doleman B and Saad M describe suitable materials in Thermal Characterization of AS4/3501-6 Carbon Epoxy Composites published as an electronic theses at https://digital.library.ncat.edu/cgi/viewcontent.cgi?article=1119&context=theses. As another example, Ulu describes suitable materials in Measurement of Multidirectional Thermal Conductivity of Im7-G/8552 Unidirectional Composite Laminate published as an electronic theses at https://digital.library.ncat.edu/cgi/viewcontent.cgi?article=1263&context=theses. In one embodiment, a graphene composite that provides good damping and thermal conduction is a combination of Carbon (AS4 3K 8HS) Epon 828 and a Carbon (cross ply)/epoxy. Another embodiment combines Carbon (AS4 3K 8HS) Epon 828 and AS4/3501-01 UD carbon/epoxy prepreg. Variations of these materials may be selected to achieve desired thermal and flexibility characteristics.

Figure 3:
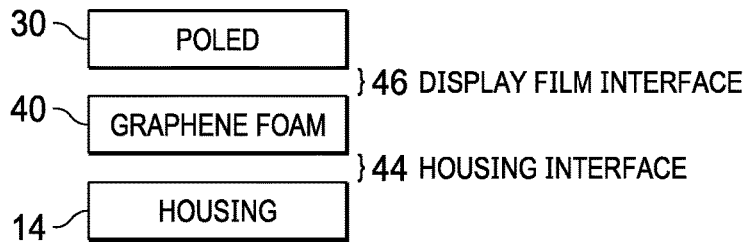
FIG. 3 depicts a side cutaway view of a POLED display film configured to couple to a housing.

Referring now to FIG. 3, a side cutaway view depicts a POLED display film 30 configured to couple to a housing portion 14 and having a graphene foam 40 disposed between the display film and housing materials. In the example embodiment, a housing interface material 44 is disposed between housing portion 14 and graphene foam 40, and a display film interface 46 is disposed between POLED display film 30 and graphene foam 40. As an example, housing interface 44 and display film interface 46 are graphene sheets, such as are available from Nanografi at https://nanografi.com/graphene/graphene-sheet-size-29-cm-x-29-cm-thickness-35-m-highly-conductive/or the DSN5000 Series model from DSN Thermal Solutions. In various embodiments, the graphene sheet interfaces may be provided only between POLED display film 30 and graphene foam 40 or only between housing 14 and graphene foam 40. For instance, one or more or both of POLED display film 30 and housing 14 may directly couple to graphene foam 40, such as with an adhesive or structural compression. Other types of interface materials may also be used, such as thermal grease. Advantageously, the increased thermal conductivity of the composite graphene foam allows a thinner interface material so that housing thickness may be decreased at the display.

In one embodiment, display film interface 46 and housing interface 44 as well as graphene foam 40 may be formed with a graphene elastomer to provide improved load bearing and deformation response. For instance, a polyurethane based graphene elastomer provides good thermal and structural characteristics, such as the Durafoam, Duraflex and Airflex products available from Monmouth at https://monmouthrubber.com/chart-durafoam-duraflex-and-airaflex-are-available-in-the-following-types-of-rubbers/. Such graphene foam composites have an addition of 2 percent weight graphene foam that enhances the glass transition temperature of epoxy from 106 to 162 degrees Celsius, improving the thermal stability of the polymer composite. Graphene fiber aids in load-bearing, increasing the ultimate tensile strength by 12% with as little as 3 percent weight graphene fiber in an epoxy matrix.

Although the present invention has been described in detail, it should be understood that various changes, substitutions and alterations can be made hereto without departing from the spirit and scope of the invention as defined by the appended claims.

What is claimed is:

1. An information handling system comprising:
   a housing having first and second rotationally coupled housing portions;
   a processor disposed in the housing and operable to execute instructions that process information;
   a memory disposed in the housing and interfaced with the processor, the memory storing the instructions and information;
   a display film interfaced with the processor and having plural OLED pixels that cooperate to present the visual images; and
   a graphene foam composite disposed between the display film and the housing and configured to conduct thermal energy from the display film in an X-plane.

2. The information handling system of claim 1 wherein the graphene foam composite comprises:
   a silicone resin; and
   graphene particles suspended in the silicon resin and oriented to direct thermal energy from the display film along a perpendicular axis relative to the display film.

3. The information handling system of claim 1 wherein the graphene foam couples directly against the display film.

4. The information handling system of claim 1 wherein the graphene foam comprises a graphene elastomer having a polyurethane resin.

5. The information handling system of claim 1 wherein the graphene foam has a direct contact against both the housing and the display film.

6. The information handling system of claim 1 further comprising a graphene sheet disposed between the graphene foam and the display film.

7. The information handling system of claim 1 further comprising a graphene sheet disposed between the graphene foam and the housing.

8. The information handling system of claim 1 further comprising:
   a hinge rotationally coupling the first and second housing portions;
   wherein the display film and graphene foam composite are disposed across the hinge.

9. The information handling system of claim 1 wherein the display film comprises a plastic substrate.

10. A method for supporting a display film in an information handling system housing, the method comprising:
    suspending graphene particles in a resin to define a graphene foam composite having a planar form;
    coupling the graphene foam between the information handling system housing and a display film;
    presenting visual images at the display film; and
    transferring thermal energy generated as a byproduct of the presenting visual images through the graphene foam in an X-plane to the housing.

11. The method of claim 10 wherein the display film comprises plural OLED pixels that cooperate to generate the visual image.

12. The method of claim 11 wherein the display film further comprises a plastic substrate.

13. The method of claim 10 wherein the suspending graphene particles in a resin further comprises suspending the graphene particles in a silicone resin.

14. The method of claim 10 wherein the coupling the graphene foam further comprises coupling the graphene foam directly to the display film.

15. The method of claim 10 wherein the coupling the graphene foam further comprises coupling the graphene foam directly to the housing.

16. The method of claim 10 further comprising coupling a graphene sheet between the housing and the graphene foam.

17. The method of claim 10 further comprising:
rotating first and second portions of the housing about a hinge; and
supporting the display film with the graphene foam at the hinge between the first and second housing portions.

18. A display structure comprising:
a display film having OLED pixels that cooperate to present a visual image;
a housing configured to hold the display film; and
graphene particles suspended in an intermediary material as a graphene foam to transfer thermal energy from the display film along an X-plane to the housing.

19. The display structure of claim 18 wherein:
the display film comprises a POLED; and
the graphene particles intermediary material comprises a silicon resin.

20. The display structure of claim 19 further comprising a graphene elastomer disposed on at least one side of the graphene foam.

* * * * *